United States Patent [19]

Mathias

[11] Patent Number: 4,496,607
[45] Date of Patent: Jan. 29, 1985

[54] LASER PROCESS FOR PRODUCING ELECTRICALLY CONDUCTIVE SURFACES ON INSULATORS

[75] Inventor: Eckart Mathias, Catonsville, Md.

[73] Assignee: W. R. Grace & Co., New York, N.Y.

[21] Appl. No.: 574,391

[22] Filed: Jan. 27, 1984

[51] Int. Cl.³ .......................... B05D 3/06; B05D 5/12
[52] U.S. Cl. ..................................... 427/53.1; 427/96
[58] Field of Search ................................ 427/53.1, 96; 219/121 LE

[56] References Cited

U.S. PATENT DOCUMENTS

| | | | |
|---|---|---|---|
| 4,117,302 | 9/1978 | Earle et al. | 219/121 LM |
| 4,200,669 | 4/1980 | Schaefer et al. | 427/53.1 |
| 4,258,078 | 3/1981 | Celler et al. | 427/43.1 |
| 4,281,030 | 7/1981 | Silfvast | 427/42 |
| 4,299,860 | 11/1981 | Schaefer et al. | 427/53.1 |
| 4,300,474 | 11/1981 | Livsey | 118/641 |
| 4,348,263 | 9/1982 | Draper et al. | 427/53.1 |
| 4,359,485 | 11/1982 | Donnelly et al. | 427/53.1 |
| 4,404,569 | 9/1983 | Neumann et al. | 346/108 |

FOREIGN PATENT DOCUMENTS

| | | | |
|---|---|---|---|
| 52-23664 | 2/1977 | Japan | 427/53.1 |
| 56-6497 | 1/1981 | Japan | |
| 57-185927 | 11/1982 | Japan | 427/53.1 |

*Primary Examiner*—John H. Newsome
*Attorney, Agent, or Firm*—Richard P. Plunkett; William W. McDowell, Jr.

[57] ABSTRACT

The subject disclosure relates to a process for producing electrically conductive surfaces on insulating substrates which comprises use of a laser beam to melt tracks onto said substrates into which conductive particles are simultaneously impinged, resulting thereby in the formation of computer controlled patterns designed according to tracings characteristic of those used in the manufacture of electric/electronic circuit boards.

7 Claims, 1 Drawing Figure

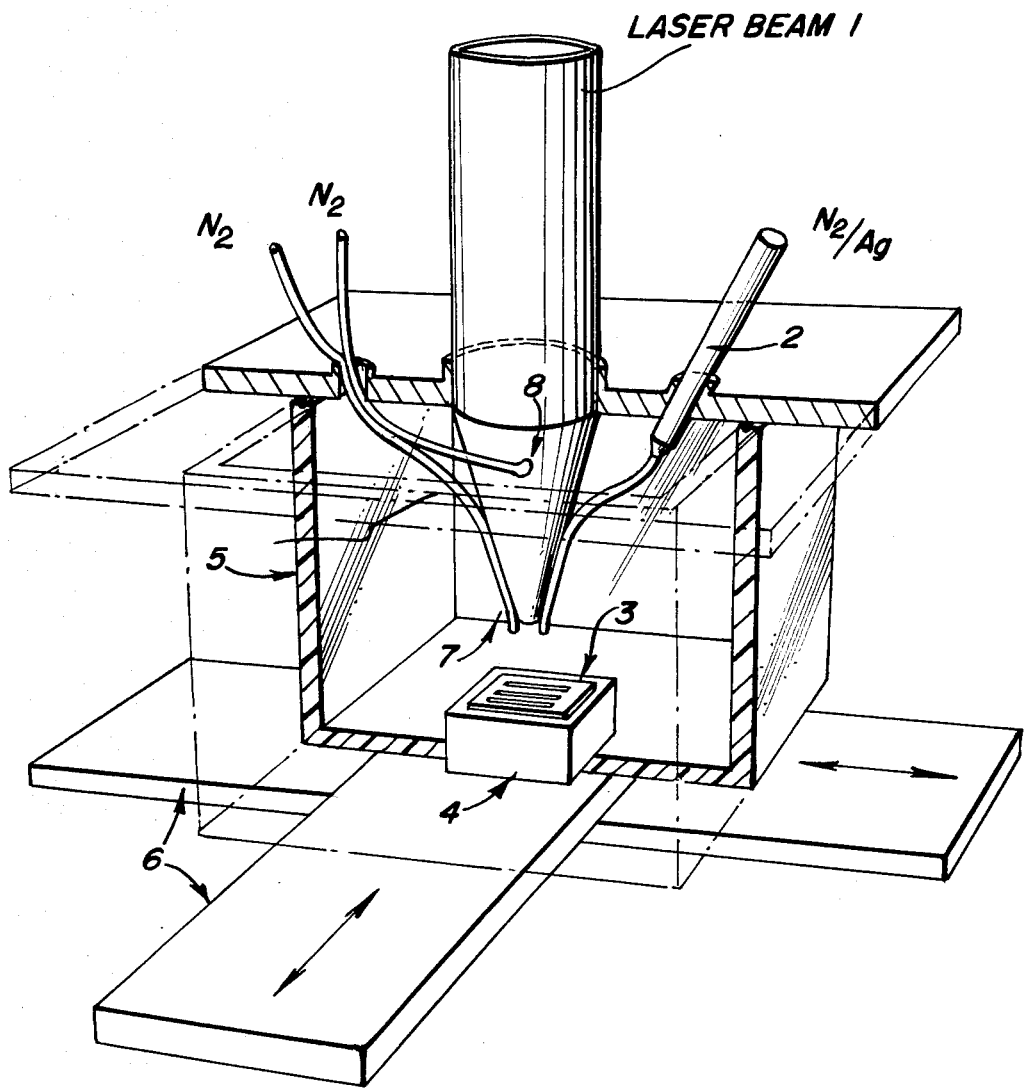

LASER PROCESS FOR PRODUCING ELECTRICALLY CONDUCTIVE SURFACES ON INSULATORS

BACKGROUND OF THE INVENTION

Description of the Prior Art

Conductive circuits have mostly been made by a print-and-etch technique, a multi-step time-consuming process, which generates significant amounts of environmentally undesirable waste. The most widely used alternative at this time, but still limited in its application, is the technique of producing a circuit pattern on a desired substrate by screen printing an organic resin-containing conductive ink on said substrate and then curing and/or firing said ink. Most of these inks are solvent based and heat cured, again resulting in production of environmentally undesirable waste while also consuming significant amounts of energy. There are also screen printable solventless and radiation-curable systems but these show considerable viscosity limitations. In addition, all the above inks, beside being generally quite slow in curing tend also to be non-solderable and are generally not suitable for high temperature applications.

OBJECTS OF THE INVENTION

It is therefore an object of this invention to provide a process of producing electric/electronic circuit boards which does not result in the production of environmentally undesirable waste products, which allows for a significant increase in rate of production of said boards primarily by virtue of not utilizing curable resins and thereby being independent of the intricate curing characteristics of any particular resin.

It is an additional object of the subject invention to provide a system of producing electric/electronic circuit boards which can be made suitable for high temperature application, which is solderable, and which can be produced in a rigid or flexible form.

It is therefore an object of this invention to provide a system for producing electric/electronic circuit boards which overcomes the aforementioned limitations of the prior art.

These and other objects will become clear as the description of the subject invention proceeds.

DETAILED DESCRIPTION OF THE INVENTION

The subject invention was developed in the course of a research program designed to overcome limitations encountered in the prior art related to production of electric/electronic circuit boards.

The objectionable limitations encountered in the prior art which teaches the construction of said electric/electronic circuit boards center primarily on two elements; (a) most systems involve emissions of environmentally undesirable waste products and (b) most systems which utilize curable resins have their production rate dependent on the cure rate of said resins besides resulting in products which usually are non-solderable and not adapted for use at high temperature conditions.

In an effort to overcome these and other prior art drawbacks, the following idea was reduced to practice.

A "tracing" of a circuit was projected onto a dielectric substrate by melting tracks conforming said circuit's pattern on said dielectric substrate using a laser beam. When simultaneous to said track melting process conductive particles were impacted onto said molten tracks, the product upon solidification of said tracks with conductive particles therein functioned as an electrical circuit.

As used herein, the term "conductive" in relation to the particle material employed to form a conductive surface means electrically conductive. However, it should be noted that these same materials are also thermal conductors; so the resulting patterns on the dielectric substrates can be used as heat sinks if desired. Thus, any material, e.g., metal or conductive carbon, such as graphite, is operable herein to form a conductive surface. Specific examples of operable metals used as a conductive material herein include, but are not limited to, Al, Zn, Sn, Pt, Pd, Ni, Au, Cu and Mg, and alloys such as stainless steel.

Before further detailing the specific characteristics of the present invention let us back-track to the known concept of using lasers in the coating technology.

We may refer to a number of prior art references documenting the technology of fusibly bonding coating materials to substrates using lasers to either pre-heat said substrates or to premelt said coating material and, in some case, using more than one laser, which in this case is pulsed so that one will not interfere with the other, in order to preheat both coating material as well as substrate. Thus, in U.S. Pat. No. 4,117,302 a coating process is described wherein a coating material is fusibly bonded to a metal substrate via a method comprising simultaneous liquefaction of the coating material and the substrate surface with a laser beam. Additionally, U.S. Pat. No. 4,200,669 teaches a surface coating process by application of laser beam molten particles to a solid surface. Also, in U.S. Pat. No. 4,348,263 a radiant energy source such as a laser is used to pretreat and effect rapid melting of a surface layer of a metallic substrate prior to coating it with a protective metal by any of the prior art techniques such as electroplating. Additional prior art of the type may be found in the form of U.S. Pat. Nos. 4,300,474, 4,299,860 and 4,281,030, the last of which using pulsed beams projected onto substrate and coating material, both in a vacuum in view of the atomic particle size used therein.

Thus, as evidenced by the foregoing, the concept of coating materials using lasers to effect fusible bonding per se has been known, which is not, however, the case when it comes to the concept of using lasers to produce electrical circuits within the context of the parameters of the present invention.

The closest the prior art comes to describing the use of lasers in conjunction with production of electric/electronic circuit boards is in such patents as U.S. Pat. No. 4,258,078 wherein a laser is used exclusively to obtain a rounded edge on an already deposited circuit element may be the conventional print-etch technique. The pulsed laser allows the edge of the metal element to melt and quench so rapidly that surface tension acts on the shape of said element, but flow does not occur. Additionally, U.S. Pat. No. 4,404,569 teaches lasers used in conjunction with printed circuit boards; however, only within the context of the production of the artwork used for making said boards which normally are prepared photographically. An even further patent documenting the use of lasers in conjunction with the formation of, in this case, a metallic layer on the surface of semi-conductors can be found in the form of U.S. Pat. No. 4,359,485. Therein, however, the deposition of said metallic layer takes place by allowing the semi-conductor surface to come into contact with a metal-containing solution followed by directing laser radiation through the solution which results in a thermally induced chemical reaction between the semi-conductor surface and said solution causing metal from said solution to be deposited onto said surface.

Finally, also worthy of note from a prior art viewpoint is Japanese Patent No. J56 006497-D12 which, while teaching use of a laser beam to imprint a track on a substrate for micro-electronic integrated circuits, does so within the context of teaching a process requiring a sintering step which in addition to other distinctions, which will become clear as the description of the invention proceeds, causes it to markedly differ from said subject invention.

Now, to proceed with the detailed description of the subject invention, as stated previously, it relates to a novel process which allows for manufacture of flexible and rigid electric/electronic circuit boards at a rate of production greater than that achieved by conventional processes and, additionally, said process characterizes itself advantageously over other prior art processes in that it does not result in the production of environmentally undesirable by-products.

The novel feature of the present invention consists of making a flexible or rigid electrical circuit by melting a "tracing" of the circuit onto the dielectric with a laser beam while simultaneously impacting metal particles into the traced molten tracks. The binding of the conductive material (e.g., metals, conductive carbons, etc.) to the substrate is achieved by the very material of which the substrate is made. The conductive layer, when made of an appropriate pure metal, is solderable like those conductive layers made via the print-and-etch process.

The process works with any thermoplastic dielectric or with any other common inorganic dielectric which can be made molten with a laser beam (e.g., alumina, silica, beryllia, etc.). Whereas the print-and-etch and screen-printing-and-cure processes are relatively slow, the present process being independent of the time dependent parameters characterizing the afore-mentioned ones (e.g., duration of resin cure), is a much faster one.

Thus, in reducing the subject invention to practice a conductive trace was made on several types of substrates by melting said trace into said substrates using a pulsed wave, or preferably continuous wave, focused, or out-of-focus, $CO_2$ laser beam while almost simultaneously causing conductive particles to impinge onto the molten tracks formed on said substrates. Under these circumstances the particles impact into said substrates and fusibly bond thereto. Since a high enough particle density was used so as to have the particles in contact with each other, the trace was able to conduct electrical current and heat. This process of making an electrical conductor could be used to make, for example, electrical circuits per se, heat sinks in electrical circuits, conduits for electrical discharges, EMI shields, etc. Depending upon the substrate and conductive particles used, the impaction of the particles can be achieved even without heating the substrate.

Now, more specifically and as examples, silver flakes and, in some cases, copper flakes were impacted onto laser-beam molten tracks on various dielectric substrates.

The silver flakes used were, e.g., Silflake 135 TM from Handy and Harman. Pencil-type "mini-sandblasters", Model AEC and Model 501-AB-FR from Hunter Associates were used to blast said flakes onto said dielectric materials.

The blasting was carried out with the substrate at room temperature. The blasting is carried out at pressures ranging from slightly above atmospheric up to 100 psi, preferably at the lower end of the pressure range, since higher pressures blow the melt out of the track thereby precluding good adhesion of the conductive particles thereto. Depending on the conductive material used, cold-welding of the particles occurs. These fused particles can readily be seen microscopically in the case of silver.

The description of the apparatus used in the subject invention is best understood with reference to the accompanying drawing and the explanation which follows.

DESCRIPTION OF THE DRAWING

The FIGURE is a perspective drawing with portions in cross section of the apparatus set-up for the invention's experimentation.

While the laser beam 1 and the blaster 2 remain stationary, the dielectric substrate 3, on platform 4, inside of box 5, which, in turn, is bolted to the XY-table 6, is moved under the laser beam 1 and blaster jet 2 by means of said XY-table 6, the movement of which was controlled by a computer (not shown) programmed to follow a predetermined circuit pattern.

Nitrogen gas at inlets 7 and 8 was combined with the silver flake-nitrogen gas mixture exiting from blaster 2 and generally functioned to maintain an inert atmosphere and to serve as a propellant.

The computer was programmed to have the XY-table 6 moved in a manner such as to allow the laser beam 1 to melt the surface of substrate 3 in a pattern of several 10 cm-long parallel lines. The on-off of the laser beam was also automated and the on-off of the blaster was operated manually. However, both on-off systems could be automated by the computer.

The above described set-up was used to conduct numerous experiments which established the most important parameters needed to obtain good quality conductive traces and the data obtained from the following experiments are outlined in the Table below. Said examples, while in no way intended to be limiting, will further aid in the understanding of this invention:

EXAMPLES

TABLE I

| | Laser Process for Electronic Circuit Boards | | | | | |
|---|---|---|---|---|---|---|
| Examples | Substrate | Metal | R/l (ohm/cm) | $l^{(a)}$ (cm) | Resistivity (ohm-cm) | Remarks[b] |
| 1 | Mylar 500EL | Silver | 1.3 | 7.7 | $5.0 \times 10^{-5}$ | 1 |
| 2 | Mylar 500EL | Silver | 2.9 | 9 | $1.1 \times 10^{-4}$ | 1 |
| 3 | Mylar 500EL | Silver | 1.6 | 8.5 | $6.1 \times 10^{-5}$ | 1 |
| 4 | Mylar 500EL | Silver | 0.9 | 1 | $3.4 \times 10^{-5}$ | 1 |
| 5 | Mylar M654 | Silver | 8.7 | 3 | $3.3 \times 10^{-4}$ | 1 |
| 6 | Mylar 500EL | Silver | 1.2 | 9 | $4.6 \times 10^{-5}$ | 1 + 1 |

TABLE I-continued

Laser Process for Electronic Circuit Boards

| Examples | Substrate | Metal | R/l (ohm/cm) | l[a] (cm) | Resistivity (ohm-cm) | Remarks[b] |
|---|---|---|---|---|---|---|
| 7 | Mylar EL(S) | Silver | 0.6 | 9 | $2.3 \times 10^{-5}$ | 1 + 1 |
| 8 | Mylar EL(S) | Silver | 0.14 | 9 | $5.3 \times 10^{-6}$ | 1 + 3 |
| 9 | Mylar EL(S) | Silver | 0.4 | 9 | $1.5 \times 10^{-5}$ | 1 + 2 |
| 10 | Mylar EL(S) | Copper Powder | 2.3 | 1 | $8.8 \times 10^{-5}$ | 1 + 1 |
| 11 | Mylar EL(S) | Copper Powder | 14.1 | 9 | $5.4 \times 10^{-4}$ | 1 + 1 |
| 12 | Mylar EL(S) | Copper Flake | 20 | 7 | $7.6 \times 10^{-4}$ | 1 + 1 |
| 13 | Mylar EL(S) | Copper Flake | 10 | 1 | $3.8 \times 10^{-4}$ | 1 + 1 |
| 14 | Polystyrene | Silver | 2.4 | 7 | $9.1 \times 10^{-5}$ | 1 |
| 15 | Polystyrene | Silver | 2.3 | 9 | $8.8 \times 10^{-5}$ | 1 |
| 16 | Polystyrene | Silver | 2.5 | 9 | $9.5 \times 10^{-5}$ | 1 + 1 |
| 17 | Polystyrene | Silver | 0.2 | 3 | $7.6 \times 10^{-6}$ | 1 + 2 |
| 18 | Polystyrene | Silver | 1.2 | 9 | $4.6 \times 10^{-5}$ | 1 + 2 |
| 19 | Polymethylmethacrylate | Silver | 5.7 | 9 | $2.2 \times 10^{-4}$ | 1 |
| 20 | Polymethylmethacrylate | Silver | 7.1 | 9 | $2.7 \times 10^{-4}$ | 1 + 1 |
| 21 | Polycarbonate | Silver | 2.6 | 7 | $9.9 \times 10^{-5}$ | 1 + 1 |
| 22 | Cellulose Acetate | Silver | 2.7 | 9 | $1.0 \times 10^{-4}$ | 1 + 1 |

[a] l (max.) = 9 cm
[b] 1 means: Laser and blaster going simultaneously (normal mode)
1 + 1 means: Normal mode plus one extra laser pass
1 + 2 means: Normal mode plus two extra laser passes
1 + 3 means: Normal mode plus three extra laser passes The above experimental results demonstrate the invention's practicability which is not limited to the thermoplastic dielectrics used therein but, as experimentation has shown, is also applicable for any other common dielectrics which need only be meltable by a laser beam, i.e., this category obviously includes such common dielectric substrates as alumina, silica, beryllia, etc.

Example 23

The conductive lines on the substrate of Example 9 (TABLE I) were interconnected by soldering a tinned copper wire from one line to another. Another connection was made by soldering an untinned, HCl-cleaned copper wire. In both cases regular Sn63 tin-lead rosin-core solder was used. A good connection was obtained in both cases.

I claim:

1. A method of producing electrically conductive surfaces on insulator surfaces characterized in that it uses a laser beam to melt tracks onto said insulator surfaces which are simultaneously impacted upon by conductive particles which, upon fusibly bonding to said molten insulator surface, constitute an electrical conductor.

2. The method according to claim 1 further characterized in that said insulator surface may be chosen from any one constituting the group of thermoplastic or inorganic dielectric materials.

3. The method according to claim 1 further characterized in that said conductive particles may be chosen from any one constituting the group of powdery conductive materials.

4. The method according to claim 2 wherein said dielectric materials comprise polyethylene terephthalate, polystyrene, polymethylmethacrylate, polycarbonate, cellulose acetate, alumina, silica and beryllia.

5. The method according to claim 3 wherein said powdery conductive materials comprise silver and copper flakes.

6. A rigid electric/electronic circuit prepared according to the steps outlined in the method described in claim 1.

7. A flexible electric/electronic circuit prepared according to the steps outlined in the method described in claim 1.

* * * * *